(12) United States Patent
Ukai

(10) Patent No.: US 8,327,236 B2
(45) Date of Patent: Dec. 4, 2012

(54) ERROR JUDGING CIRCUIT AND SHARED MEMORY SYSTEM

(75) Inventor: Masaki Ukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 486 days.

(21) Appl. No.: 12/604,544

(22) Filed: Oct. 23, 2009

(65) Prior Publication Data

US 2010/0125771 A1 May 20, 2010

(30) Foreign Application Priority Data

Nov. 18, 2008 (JP) ................................. 2008-294828

(51) Int. Cl.
*H03M 13/00* (2006.01)

(52) U.S. Cl. ........ 714/781; 714/758; 714/763; 714/764; 714/769

(58) Field of Classification Search .................. 714/758, 714/763–764, 769
See application file for complete search history.

(56) References Cited

U.S. PATENT DOCUMENTS

| | | | | |
|---|---|---|---|---|
| 4,162,480 A | * | 7/1979 | Berlekamp | .................... 714/784 |
| 4,498,175 A | * | 2/1985 | Nagumo et al. | ............... 714/756 |
| 4,567,568 A | * | 1/1986 | Inagawa et al. | ............... 708/650 |
| 4,637,021 A | | 1/1987 | Shenton | |
| 5,155,734 A | | 10/1992 | Kashida | |
| 5,226,043 A | | 7/1993 | Pughe, Jr. et al. | |
| 5,313,464 A | * | 5/1994 | Reiff | .............................. 714/701 |
| 5,325,370 A | * | 6/1994 | Cleveland et al. | ............. 714/755 |
| 5,790,447 A | | 8/1998 | Laudon et al. | |
| 5,793,779 A | * | 8/1998 | Yonemitsu et al. | ........... 714/764 |
| 6,049,476 A | | 4/2000 | Laudon et al. | |
| 6,574,774 B1 | | 6/2003 | Vasiliev | |
| 7,353,336 B2 | | 4/2008 | Gaither | |
| 2001/0052103 A1 | * | 12/2001 | Hirofuji et al. | ................ 714/781 |
| 2001/0053225 A1 | * | 12/2001 | Ohira et al. | .................... 380/239 |

(Continued)

FOREIGN PATENT DOCUMENTS

CN 1288542 3/2001

(Continued)

OTHER PUBLICATIONS

Iancu, "Efficient Reed-Solomon Iterative Decoder Using Galois Field Instruction Set" Apr. 2008, Sandbridge Technologies, pp. 1-10.*

(Continued)

*Primary Examiner* — Scott Baderman
*Assistant Examiner* — Jeison C Arcos
(74) *Attorney, Agent, or Firm* — Staas & Halsey LLP

(57) ABSTRACT

An error judging circuit includes a first EOR circuit tree that generates a check bit of a correction code by polynomial remainder calculation with respect to a polynomial expression of an original code which is protected from an error with respect to data of m bit block unit by addition in a Galois extension field GF ($2^m$) in $S_m$EC-$D_m$ED using Reed-Solomon code, a second EOR circuit tree for generating syndromes from $S_n=Y(\alpha^n)$ with respect to code C(x) in which the check bit is added to the original code when a polynomial representation of a code which is to be detected an error and has a possibility that an error is mixed is Y(x), and an error detection circuit unit that detect if there is a one block error, a two block error, or no error based on whether or not an equation of syndromes $S_1^2=S_0S_2$ is satisfied.

18 Claims, 14 Drawing Sheets

U.S. PATENT DOCUMENTS

| | | | |
|---|---|---|---|
| 2003/0135810 A1* | 7/2003 | Hsu et al. | 714/784 |
| 2004/0236901 A1 | 11/2004 | Briggs | |
| 2005/0289440 A1* | 12/2005 | Nerl et al. | 714/763 |
| 2007/0098021 A1* | 5/2007 | Brennan | 370/503 |
| 2007/0226593 A1* | 9/2007 | Mead et al. | 714/769 |
| 2008/0162991 A1 | 7/2008 | Dell et al. | |
| 2008/0235560 A1 | 9/2008 | Colmer et al. | |
| 2008/0307289 A1* | 12/2008 | Hsu | 714/759 |

FOREIGN PATENT DOCUMENTS

| | | |
|---|---|---|
| CN | 101258471 | 9/2008 |
| JP | 54-057848 | 5/1979 |
| JP | 2-215231 | 8/1990 |
| JP | 9-120671 | 5/1997 |
| JP | 11-232129 | 8/1999 |
| JP | 2006-252545 | 9/2006 |

OTHER PUBLICATIONS

Chinese Patent Office Action mailed May 28, 2012 for corresponding Chinese Patent Application No. 200910212292.4.

European Search Report mailed Sep. 10, 2012, for corresponding European Application No. 09174357.5.

* cited by examiner

| | BLOCK 18 | BLOCK 17 | BLOCK 16 | BLOCK 15 | BLOCK 14 | BLOCK 13 | BLOCK 12 | BLOCK 11 | BLOCK 10 | BLOCK 9 | BLOCK 8 | BLOCK 7 | BLOCK 6 | BLOCK 5 | BLOCK 4 | BLOCK 3 |
|---|---|---|---|---|---|---|---|---|---|---|---|---|---|---|---|---|
| | $d_{127-120}$ | $d_{119-112}$ | $d_{111-104}$ | $d_{103-96}$ | $d_{95-88}$ | $d_{87-80}$ | $d_{79-72}$ | $d_{71-64}$ | $d_{63-56}$ | $d_{55-48}$ | $d_{47-40}$ | $d_{39-32}$ | $d_{31-24}$ | $d_{23-16}$ | $d_{15-8}$ | $d_{7-0}$ |
| $c_{23}$ | 00011111 | 01000100 | 01100001 | 01100110 | 01011000 | 11100101 | 10011101 | 01100010 | 10100110 | 11000110 | 10100010 | 11111100 | 00000001 | 11100110 | 01011000 | 11100000 |
| $c_{22}$ | 00001111 | 10100010 | 10110000 | 10110011 | 00101100 | 01101110 | 01001110 | 00110001 | 11010011 | 01100110 | 11010000 | 11111110 | 10000000 | 11110000 | 00101100 | 01110000 |
| $c_{21}$ | 10000111 | 01010001 | 11011000 | 10101001 | 00010110 | 10111001 | 01001111 | 00011000 | 11101001 | 10110010 | 11101000 | 11111111 | 01000000 | 01111000 | 00010110 | 10111000 |
| $c_{20}$ | 01000011 | 00101000 | 01101100 | 01011100 | 00001011 | 11011100 | 00100111 | 00001100 | 00110100 | 01011001 | 11101100 | 01111111 | 00100000 | 00111100 | 00001011 | 01011100 |
| $c_{19}$ | 10111110 | 11010100 | 00101110 | 00101110 | 01011101 | 11000010 | 10010100 | 01100100 | 11101100 | 01011110 | 11101110 | 11100011 | 10000100 | 11111000 | 01011101 | 01000111 |
| $c_{18}$ | 11000000 | 10101010 | 00010010 | 11111110 | 01110110 | 10000000 | 11010110 | 11010000 | 01111100 | 10111010 | 01000100 | 11101101 | 00011001 | 10000100 | 01100011 | 11100111 |
| $c_{17}$ | 01111111 | 11011100 | 10000010 | 10011001 | 01100001 | 10010101 | 01110011 | 10010101 | 10011010 | 00011110 | 10000111 | 11101010 | 00101101 | 11001111 | 01100011 | 10000001 |
| $c_{16}$ | 00111111 | 10000000 | 11000010 | 11001100 | 01111000 | 10010010 | 01101000 | 11001001 | 01001101 | 10001111 | 01000011 | 11110010 | 00000010 | 10011100 | 01101100 | 11000000 |
| $c_{15}$ | 10110011 | 10101000 | 11100001 | 01100010 | 10101101 | 01111010 | 00010010 | 11001011 | 10101110 | 10110100 | 01011110 | 10101100 | 00011110 | 01011101 | 10000010 | 01110000 |
| $c_{14}$ | 11011000 | 11000100 | 11010010 | 11110110 | 10000010 | 00111110 | 00101011 | 11100101 | 01010101 | 01011010 | 10100110 | 01010111 | 00011110 | 01001010 | 11000010 | 00111000 |
| $c_{13}$ | 11101100 | 01100010 | 11000000 | 00111010 | 11101101 | 11011101 | 00110110 | 01101011 | 01011001 | 10101100 | 10101011 | 01001111 | 00010101 | 01101110 | 11000001 | 10011100 |
| $c_{12}$ | 11110110 | 10110001 | 01110100 | 00110110 | 11101001 | 10001100 | 00001101 | 10011010 | 01010100 | 00011011 | 00101101 | 00101001 | 11011101 | 01110010 | 01001010 | 11000001 |
| $c_{11}$ | 11100101 | 01011001 | 00111100 | 00101110 | 10110011 | 01100001 | 01100011 | 10001101 | 11001100 | 00100100 | 10100110 | 00100100 | 10001001 | 10111000 | 10101110 | 00001001 |
| $c_{10}$ | 01111001 | 10101100 | 00111001 | 01110110 | 00110001 | 10110000 | 01011000 | 01011011 | 10000101 | 01111110 | 00110100 | 00100010 | 11000001 | 10010010 | 00100100 | 11100001 |
| $c_9$ | 11011111 | 11111110 | 10100011 | 00011010 | 00001111 | 10000100 | 10010111 | 00010111 | 00011001 | 01000111 | 01101010 | 00001111 | 01110100 | 01100010 | 00110110 | 11101000 |
| $c_8$ | 11011000 | 10001001 | 00011010 | 11101100 | 00011011 | 01111010 | 01010011 | 11001101 | 11001001 | 00001111 | 00110011 | 00001110 | 10010110 | 00011001 | 01101000 | 01101110 |
| $c_7$ | 01101110 | 01011101 | 10011111 | 11111111 | 01011011 | 00011010 | 11011100 | 10000011 | 01011001 | 01100111 | 01010100 | 01011001 | 01011100 | 11111110 | 01100111 | 11101011 |
| $c_6$ | 00101100 | 00101111 | 00001101 | 11100110 | 01101001 | 00001011 | 01100011 | 01110110 | 01000010 | 00000001 | 10010100 | 01110101 | 00011100 | 01001000 | 01000110 | 01010110 |
| $c_5$ | 10010100 | 10010010 | 01011001 | 00000001 | 10000010 | 10000100 | 10100100 | 01101110 | 00010110 | 00011011 | 00011101 | 10000000 | 11100001 | 00000101 | 01101010 | 11001001 |
| $c_4$ | 01001101 | 00001011 | 11100110 | 00110110 | 11011110 | 11011011 | 10000001 | 11111001 | 11001010 | 11101001 | 00011101 | 00100001 | 11001101 | 10000110 | 01010110 | 00100100 |
| $c_3$ | 10100111 | 10100111 | 00010110 | 00110000 | 01000010 | 10000111 | 01010011 | 11101100 | 01011100 | 11110110 | 00000000 | 01110000 | 01000011 | 01101111 | 10000100 | 11000010 |
| $c_2$ | 00011011 | 01111111 | 01011001 | 11101011 | 00000001 | 01000010 | 00101010 | 00010110 | 11101111 | 11101011 | 00100111 | 01010111 | 00101111 | 10101100 | 11110011 | 01100110 |
| $c_1$ | 10100011 | 01101000 | 10110011 | 01101001 | 01100010 | 11111000 | 01010100 | 01001011 | 01001100 | 01001101 | 10000110 | 10000110 | 10101100 | 01100001 | 01101001 | 01010001 |
| $c_0$ | 01010011 | 10100010 | 01011000 | 10110101 | 00011011 | 10001010 | 00011001 | 10001110 | 01011010 | 01111001 | 00011011 | 00101101 | 01100100 | 01001100 | 00100001 | 00100110 |

| Sn | x0 | x1 | x2 | x3 | x4 | x5 | x6 | x7 | x8 | x9 | xA | xB | xC | xD | xE | xF |
|----|----|----|----|----|----|----|----|----|----|----|----|----|----|----|----|----|
| 0y | -- | 00 | 01 | 19 | 02 | 32 | 1a | c6 | 03 | df | 33 | ee | 1b | 68 | c7 | 4b |
| 1y | 04 | 64 | e0 | 0e | 34 | 8d | ef | 81 | 1c | c1 | 69 | f8 | c8 | 08 | 4c | 71 |
| 2y | 08 | 8a | 65 | 2f | e1 | 24 | 0f | 21 | 35 | 93 | 8e | da | f0 | 12 | 82 | 45 |
| 3y | 1d | b5 | c2 | 7d | 6a | 27 | f9 | b9 | c9 | 9a | 09 | 78 | 4d | e4 | 72 | a6 |
| 4y | 06 | bf | 8b | 62 | 66 | dd | 30 | fd | e2 | 98 | 25 | b3 | 10 | 91 | 22 | 88 |
| 5y | 36 | d0 | 94 | ce | 8f | 96 | db | bd | f1 | d2 | 13 | 5c | 83 | 38 | 46 | 40 |
| 6y | 1e | 42 | b6 | a3 | c3 | 48 | 7e | 6e | 6b | 3a | 28 | 54 | fa | 85 | ba | 3d |
| 7y | ca | 5e | 9b | 9f | 0a | 15 | 79 | 2b | 4e | d4 | e5 | ac | 73 | f3 | a7 | 57 |
| 8y | 07 | 70 | c0 | f7 | 8c | 80 | 63 | 0d | 67 | 4a | de | ed | 31 | c5 | fe | 18 |
| 9y | e3 | a5 | 99 | 77 | 26 | b8 | b4 | 7c | 11 | 44 | 92 | d9 | 23 | 20 | 89 | 2e |
| Ay | 37 | 3f | d1 | 5b | 95 | bc | cf | cd | 90 | 87 | 97 | b2 | dc | fc | be | 61 |
| By | f2 | 56 | d3 | ab | 14 | 2a | 5d | 9e | 84 | 3c | 39 | 53 | 47 | 6d | 41 | a2 |
| Cy | 1f | 2d | 43 | d8 | b7 | 7b | a4 | 76 | c4 | 17 | 49 | ec | 7f | 0c | 6f | f6 |
| Dy | 6c | a1 | 3b | 52 | 29 | 9d | 55 | aa | fb | 60 | 86 | b1 | bb | cc | 3e | 5a |
| Ey | cb | 59 | 5f | b0 | 9c | a9 | a0 | 51 | 0b | f5 | 16 | eb | 7a | 75 | 2c | d7 |
| Fy | 4f | ae | d5 | e9 | e6 | e7 | ad | e8 | 74 | d6 | f4 | ea | a8 | 50 | 58 | af | ent

ERROR JUDGING CIRCUIT AND SHARED MEMORY SYSTEM

CROSS REFERENCE TO RELATED APPLICATION

This application is based upon and claims the benefit of priority from the prior Japanese Patent Application NO. 2008-294828 filed on Nov. 18, 2008, the entire contents of which are incorporated herein by reference.

FIELD

The embodiments discussed herein are related to an error judging circuit and a shared memory system.

BACKGROUND

As a method for keeping cache coherency in a multi processor system or a shared memory system, there are a SMP (Symmetric Multi Processing) system and a ccNUMA (cache coherent Non-Uniform Memory Access) system.

In the ccNUMA system, a full directory system in which a main storage memory is divided for every block having a size and information for keeping cache coherency called as a directory is stored in the main storage memory with respect to each block is generally employed. In many case, the block size is equal to a cache line size of a cache memory.

There is a method for assuring an area for storing a directory s different from the area of the main storage memory. However, when a memory different from the main storage memory is provided in order to store the directory, although the area that is used as the main storage memory may be ensured, the cost of the system is increased.

On the other hand, it is general that a main storage memory of a system specifically used as a server is a DIMM (Dual Inline Memory Module) that store parity information or a check bit of an error correction code at the portion of, for example, 1 of ratio of 8:1. There is also a method in which the portion of 1 of the ratio of 8:1 is used as the area for storing a directory in stead of parity information. However, it is important for the main storage memory of a system used as a server, that is, the DIMM to assure reliability of stored data (that is, that there is no error in data).

In the system other than the ccNUMA system, that is, in the SMP system or the like in which it is not important to store in the main storage memory other than data, $S_8EC\text{-}D_8ED$ ECC (Single-8-bit-group Error Correct, Double-8-bit-group Error Detect, Error Checking and Correcting) system is employed by storing SEC-DED ECC (Single Error Correct, Double Error Detect, Error Checking and Correcting) in the portion of one byte, or by checking data by a unit of every plurality times of reading. Particularly, in the later case, even one chip is broken down in a commercially available DIMM constituted by, for example, 18 chips, it is possible to deploy the DIMM by data correction.

Accordingly, when employing the ccNUMA system in which a system used as a serer is a full directory system, it is desirable to ensure the area for the directory while providing data integrity or data assurance by which one chip failure of the DIMM is endured like the SMP system.

On the other hand, an architecture such as a main frame has been proposed in which the main storage memory is partitioned into units each called as a page, and information called as a storage key is stored for each of the pages. By storing the key information of, for example, 4 bits in the area of the main storage memory, a memory protect function that allows access only when the same key information is included may be provided. However, in a recent multi processor system, the capacity of the main storage memory has been increased. Accordingly, the page number has been increased in proportion to the increase of the capacity of the main storage memory, and the total mount of key information has been also increased. It is general to use the DIMM that is cheap and standardized for the main storage memory. Accordingly, it is difficult to separately establish the area for storing the key information at a moderate price.

Consequently, a part of the area of the main storage memory established by the DIMM is diverted as a storage area of the key information. Consequently, the area which is normally used as the area of the main storage memory is used for storing key information, so that it is difficult to improve the utilization efficiency of the main storage memory.

[Patent Document 1] Japanese Laid-open Patent Publication No. 11-232129
[Patent Document 2] Japanese Laid-open Patent Publication No. 9-120671
[Patent Document 3] Japanese Laid-open Patent Publication No. 2006-252545
[Patent Document 4] Japanese Laid-open Patent Publication No. 54-57848

In a conventional multi processor system or a shared memory system, a part of the area of the main storage memory is used for storing information for keeping cache coherency, information for data assurance, information for protecting the memory, or the like, so that there is a problem in that it is difficult to execute data assurance while improving utilization efficiency of the area of the main storage memory without increasing the cost of the system.

SUMMARY

According to an aspect of the invention, an error judging circuit includes a first EOR circuit tree that generates a check bit of a correction code by polynomial remainder calculation with respect to a polynomial expression of an original code which is protected from an error with respect to data of m bit block unit by addition in a Galois extension field GF ($2^m$) in $S_mEC\text{-}D_mED$ using Reed-Solomon code, a second EOR circuit tree for generating syndromes from $S_n=Y(\alpha^n)$ with respect to code C(x) in which the check bit is added to the original code when a polynomial representation of a code which is to be detected an error and has a possibility that an error is mixed is Y(x), and an error detection circuit unit that detect if there is a one block error, a two block error, or no error based on whether or not an equation of syndromes $S_1^2=S_0S_2$ is satisfied.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIG. 5 is a diagram illustrating an example of a generator matrix;

FIG. 6 is a diagram illustrating an example of a generator matrix;

FIG. 10 is a diagram illustrating an example of a matrix for obtaining a syndrome;

FIG. 11 is a diagram illustrating an example of a matrix for obtaining a syndrome;

FIG. 13 is a diagram illustrating an example of a logarithmic conversion; and

DESCRIPTION OF EMBODIMENTS

According to the disclosed error judging circuit and the memory shared system, a first EOR circuit tree for generating a check bit of a correction code by polynomial remainder calculation of $C(x)=x^2I(x)\bmod P(x)$ with respect to a polynomial expression $I(x)$ of an original code of a target which is protected from an error with respect to data of m bit block unit by addition in a Galois extension field GF $(2^m)$ (m is a natural number not less than 8) in $S_mEC$-$D_mED$ using (k, k−3) Reed-Solomon code (k is a natural number not more than $2^m$) when $P(x)$ is a primitive polynomial of m-order in a Galois field GF(2), a primitive element in the Galois extension field GF $(2^m)$ is $\alpha$, and a root of $P(x)=0$ is $\alpha^i$ (i=0, . . . , m−1), a second EOR circuit tree for generating syndromes $S_0$, $S_1$, $S_2$ from $S_n=Y(\alpha^n)$ (n=0, 1, 2) with respect to code $C(x)$ in which the check bit is added to the original code when a polynomial representation of a code which is a target to be detected and has the possibility that an error is mixed is $Y(x)$, and an error detection circuit unit for detecting that there is a one block error, a two block error, or no error based on whether or not $S_1^2=S_0S_2$ is satisfied and for detecting a position p of a block error from $S_0\alpha^p=S_1$ in the Galois extension field GF $(2^m)$ are used.

By executing an encoding and decoding processing using the Reed-Solomon code as described above to the data stored in and read from the main storage memory, a space area of the main storage memory may be generated. Data assurance may be executed while improving the utilization efficiency of the area of the main storage memory by diverting the generated area for another application and by keeping error correction intensity to the same degree as the conventional degree.

Hereinafter, each embodiment of an error judging circuit and a shared memory system of the invention will be described with reference to the accompanying drawings.

Figure 1:
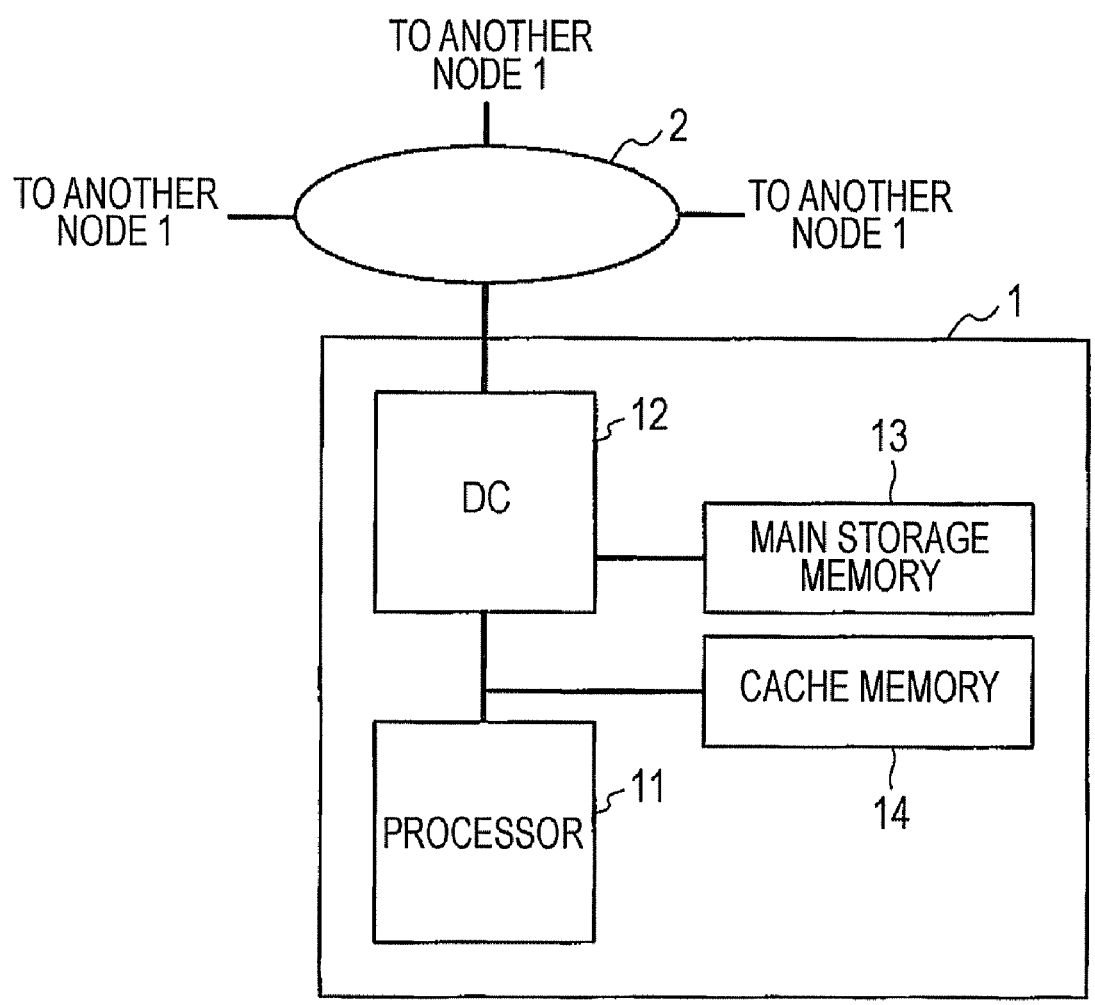
FIG. 1 is a block diagram illustrating a shared memory system in an embodiment of the invention.

FIG. 1 is a block diagram illustrating a shared memory system according to an embodiment of the invention. The shared memory system illustrated in FIG. 1 is a multiprocessor system of a ccNUMA system. The shared memory system has the structure in which a plurality of nodes 1 are connected by well-known connection means 2. Herein, for the sake of convenience of description, only one node 1 is illustrated. The node 1 includes a processor 11 such as a CPU (Central Processing Unit), a directory controller (DC) 12, a main storage memory 13, and a cache memory 14. Since the ccNUMA system is employed, in addition to data, directory information for keeping the coherency of the data that is stored in the cache memory 14 is stored in the main storage memory 13.

As described below, an encoding circuit includes a first EOR circuit tree for generating a check bit of a correction code by polynomial remainder calculation of $C(x)=x^2I(x)\bmod P(x)$ with respect to a polynomial expression $I(x)$ of an original code of a target which is protected from an error with respect to data of m bit block unit by addition in a Galois extension field GF $(2^m)$ (m is a natural number not less than 8) in $S_mEC$-$D_mED$ using (k, k−3) Reed-Solomon code (k is a natural number not more than $2^m$) when $P(x)$ is a primitive polynomial of m-order in a Galois field GF(2), a primitive element in the Galois extension field GF $(2^m)$ is $\alpha$, and a root of $P(x)=0$ is $\alpha^i$ (i=0, . . . , m−1). On the other hand, a decoding circuit includes a second EOR circuit tree for generating syndromes $S_0$, $S_1$, $S_2$ from $S_n=Y(\alpha^n)$ (n=0, 1, 2) with respect to code $C(x)$ in which the check bit is added to the original code when a polynomial representation of a code which is a target to be detected and has the possibility that an error is mixed is $Y(x)$, and an error detection circuit unit for detecting that there is a one block error, a two block error, or no error based on whether or not $S_1^2=S_0S_2$ is satisfied and for detecting a position p of a block error from $S_0\alpha^p=S_1$ in the Galois extension field GF $(2^m)$. As described below, an error judging circuit includes the first EOR circuit tree, the second EOR circuit tree, and the error detection circuit unit.

Note that in the embodiment, for the sake of description, k=36. In this case, (k, k−3) Reed-Solomon code is (36, 33) Reed-Solomon code.

Further, when m is a natural number less than 8, (k, k−3) Reed-Solomon code does not work out, so that it is important that m is a natural number not less than 8. In the embodiment, for the sake of description, m=8. However, it goes without saying that, for example, m=16, or the like.

Figure 2:
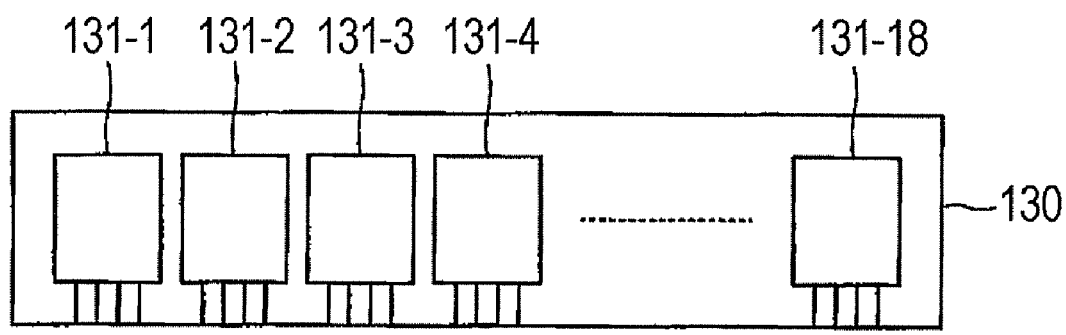
FIG. 2 is a diagram illustrating the structure of a DIMM.

The main storage memory 13 includes a plurality of DIMM's 130. Each DIMM 130 includes 18 memory chips 131-1 to 131-8 as illustrated in FIG. 2. Each memory chip 131-1 to 131-18 has a data with of 4 bits. FIG. 2 is a diagram illustrating the structure of the DIMM 130, and an address line or the like except data lines is omitted.

Figure 3:
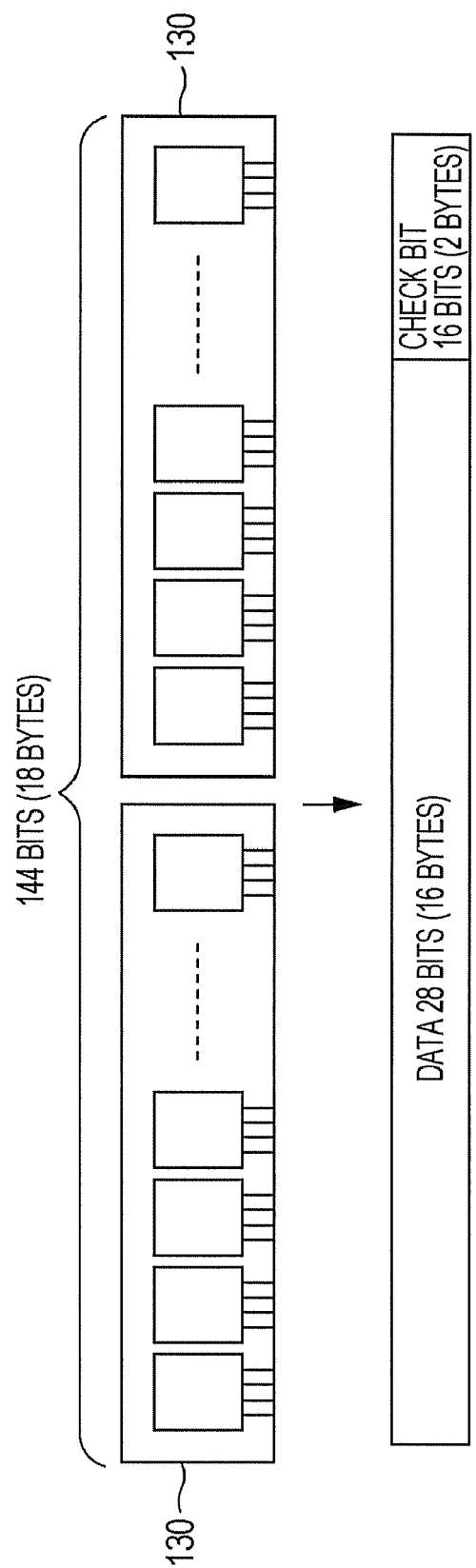
FIG. 3 is a diagram illustrating the case where an error detection and correction processing of data width of 16 bytes is provided by using two DIMM's.

The main storage memory 13 using the DIMM's 130 capable of correcting data by using an ECC has a data width of, for example, 8 bytes+1 byte (72 bits). In this case, assuming that that the DIMM 130 can resist one chip fault is a condition in order to assure reliability of data, it is sufficient to execute $S_4EC$-$D_4ED$. For example, it has been known that $S_4EC$-$D_4ED$ may be provided by providing a check bit of 16 bits with respect to data of 16 bytes. Since the ratio of the data and the check bit in this case is 8:1, as illustrated in FIG. 3, there is no bit for storing extra data in the DIMM 130. FIG. 3 is a diagram illustrating the case where a detection and correction processing of the data width of 16 bytes is provided by using two DIMM's 130.

Figure 4:
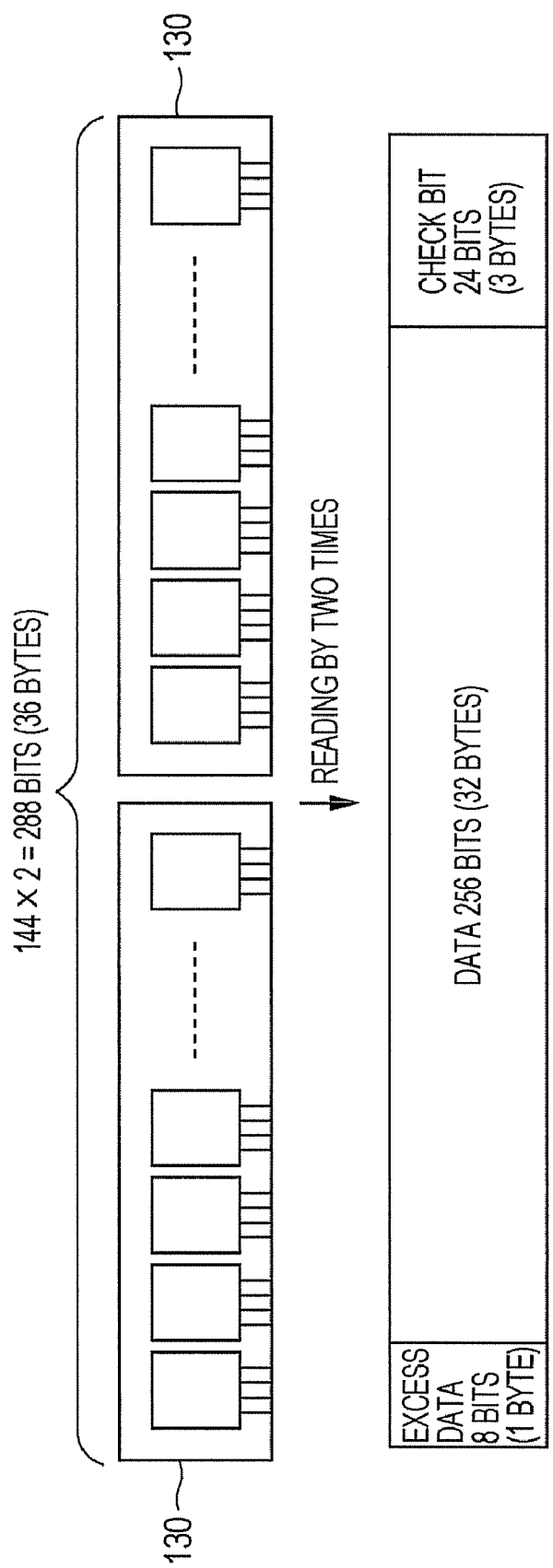
FIG. 4 is a diagram illustrating the case where an error detection and correction processing in which two reading by two interleave is regarded as one unit by using two DIMM's.

In the embodiment, by regarding two reading by 2 interleave as one unit, in the case of an $S_8EC$-$D_8ED$ code, even in the case of one chip failure, it is treated as a single error of 8 bit block. Herewith, an area of 8 bits (1 byte) may be assured for storing extra data, and data may be corrected when there is no error in another chip. FIG. 4 is a diagram illustrating the case where an error detection and correction processing in which two reading by 2 interleave is regarded as one unit is executed by using two DIMM's 130.

In the embodiment, an encoding circuit and a decoding circuit capable of high speed processing using (36, 33) Reed-Solomon code in a Galois extension field GF $(2^8)$ as an $S_8EC$-$D_8ED$ code are constituted. For example, $P(x)=x^8+x^4+$ $x^3+x^2+1$ is used for 8th order primitive polynomial P(x) in the Galois field GF(2). Assuming that the primitive element of the Galois extension field GF ($2^8$) (also the primitive element of Galois field GF(2)) is α, since the primitive polynomial P(x) is 8th order polynomial, there are 8 roots for P(x)=0, and the roots become $\alpha^i$ (i=0, . . . , 7).

Encoding Circuit $S_8EC-D_8ED$ is a code capable of correcting 1 byte error and detecting 2 byte error. A Reed-Solomon code in which the total of data and error correction code is 36 bytes becomes (36, 33) Reed-Solomon code whose data portion is 33 bytes and error correction code is 3 bytes when distance between cods is 3. Generator polynomial G(X) of the (36, 33) Reed-Solomon code may be expressed by the following expression.

$$G(x)=(x+\alpha^0)(x+\alpha^1)(x+\alpha^2)$$

In this case, assuming that the polynomial of the original code which is a target that is protected from an error (that is, error protection target) is I(x), polynomial C(x) of an error correction code is expressed by a polynomial remainder calculation of $C(x)=x^2I(x)\bmod P(x)$, and protected code F(x) is expressed by $F(x)=x^2I(x)+C(x)$.

The problem when the encoding processing is provided by a high-speed hardware circuit is a portion of the aforementioned polynomial remainder calculation. If the polynomial remainder calculation may be expressed by the form of a generator matrix similar to the existing SEC-DED ECC, it becomes easy to mount the encoding processing on hardware.

Data bit string $D=\{d_{263}, d_{262}, d_0\}$ of 33 bytes of the original code is expressed by the following polynomial. In the following polynomial, i indicate the byte position (byte 0 to 32) of a block of 33 bytes, and j indicates the bit position (bit 0 to 7) in the byte block, and each d is 0 or 1.

$$I(x) = \sum_{i=0}^{32}\sum_{j=0}^{7} d_{(8i+j)}\alpha^j x^i \qquad \text{Equation 1}$$

Herein, when the data bit string D in which only a single bit is 1 is defined as $D_i=\{$bit string in which only (263-i)-th is 1 and the others are 0$\}$, and assuming that $I_i(x)$ is a polynomial corresponding to each data bit string $D_i$, the polynomial I(x) of the original code is expressed by the linear sum of the polynomial $I_i(x)$ corresponding to the data bit in which $d_i=1$ by linearity. In $D_i$, I(x), $d_i$, i is a natural number from 0 to 263. Consequently, polynomial C(x) of an error correction code is expressed by the linear sum of $C_i(x)=X^2I_i(x)\bmod P(x)$, that is, by $C(x)=\Sigma C_i(x)$. Accordingly, the polynomial $C_i(x)$ of an error correction code related to the data bit string $D_i$ is preliminarily obtained, and it is possible to constitute a generator matrix from the polynomial $C_i(x)$ of the error correction code.

From the property of P(α)=0 of the primitive polynomial P(x), in the embodiment, the order of α is set to not more than 7 by repeatedly using $\alpha^8=\alpha^4+\alpha^3+\alpha^2+1$. Herewith, the polynomial $C_i(x)$ of the error correction code is expressed as below.

$$C_i(x) = \sum_{k=0}^{2}\left(\sum_{j=0}^{7} C_{i(8k+j)}\alpha^j\right)x^k \qquad \text{Equation 2}$$

In the polynomial $C_i(x)$ of the error correction code, K=0, 1, 2, "i" of $C_i[n]$ (n is 8k+j in the aforementioned polynomial) is the index of "C", "[n]" indicates the index of "i", each $C_i[n]$ is 0 or 1, and i is 0 to 263. The linear combination of the $\{C_{i[n]}\}$ (n=23 . . . 0) becomes the check bit string $\{C_n\}$ (n= 23 . . . 0).

$$C(x) = \sum_{i\in(di=1)} C_i(x) \qquad \text{Equation 3}$$
$$= \sum_{i\in(di=1)}\sum_{k=0}^{2}\left(\sum_{j=0}^{7} C_{i(8k+j)}\alpha^j\right)x^k$$

Since the above described equation is an addition in the Galois extension field $GF(2^8)$, the equation is substantially EOR.

Figure 5:
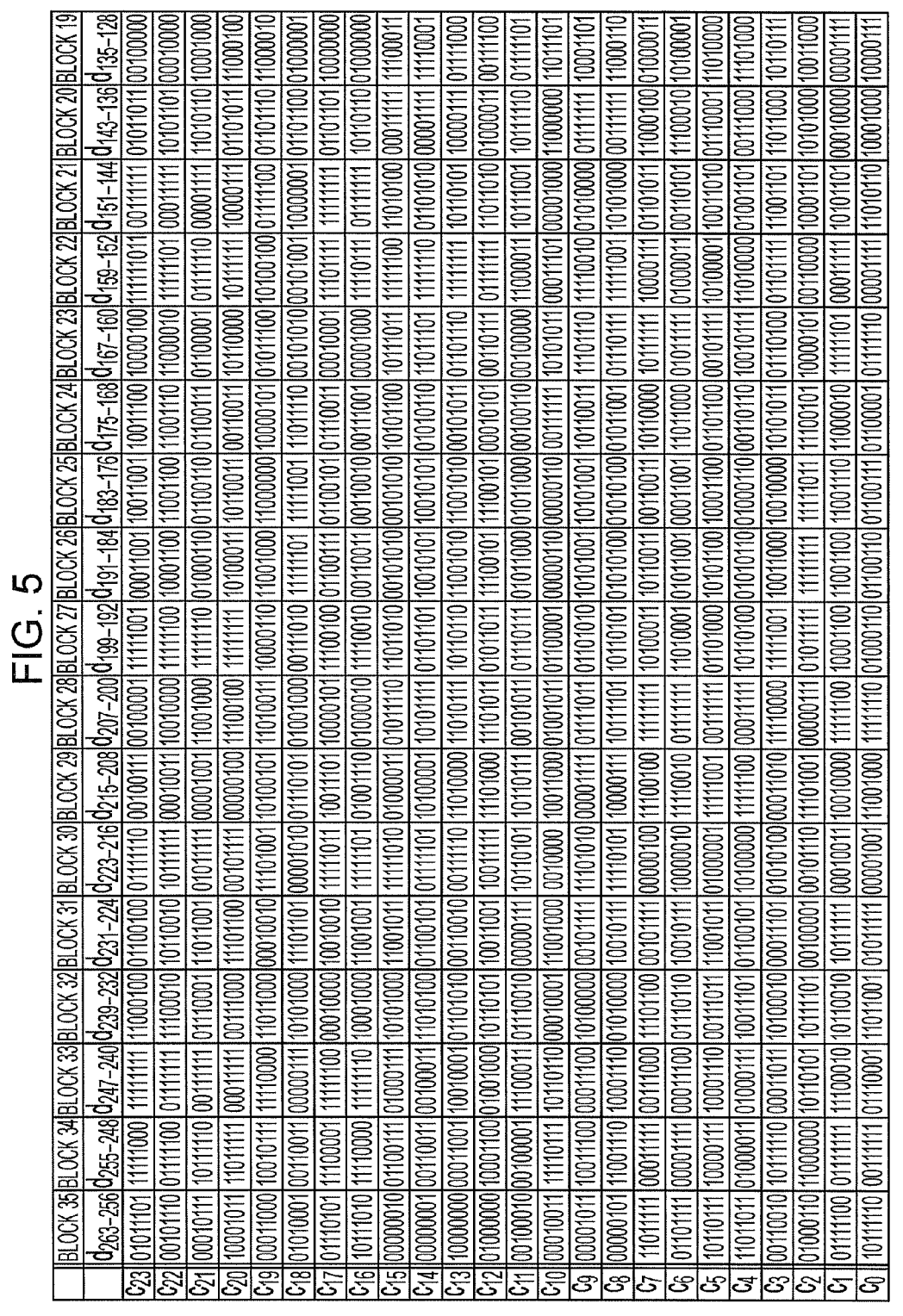

FIG. 5 and FIG. 6 are diagrams illustrating an example of the generator matrix obtained as described above. In FIG. 5 and FIG. 6, generator matrix $c_{23}$ to $c_0$ are illustrated for block numbers Block 35 to Block 3 partitioned for every byte. As for the using method itself of the bock number will be described below with the operation of a decoding circuit. Note that, the block numbers Block 2 to Block 0 are assigned for error correction code of 24 bits.

Note that, in order to improve the tolerance property of detection of data destruction in which data bit becomes all-0, a protection action may be made. For example, some of $C_n$ is inverted and stored in the DIMM 130. Note that such a protection action itself is well known, so that the description will be omitted.

Figure 7:
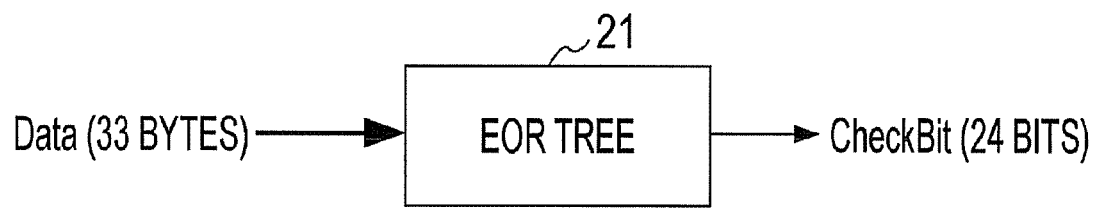
FIG. 7 is a block diagram illustrating an encoding circuit.
Figure 8:
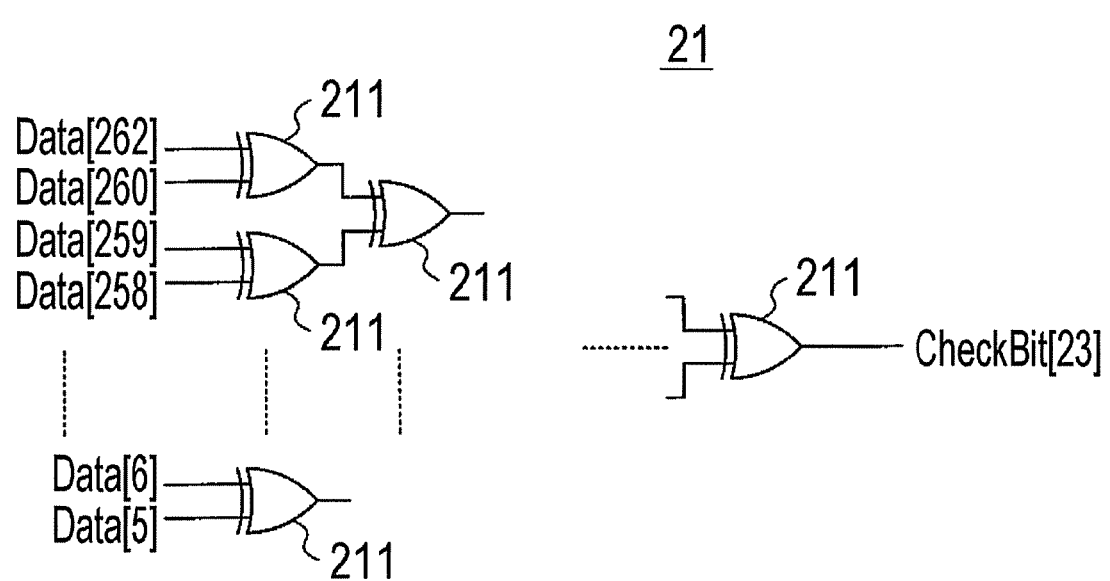
FIG. 8 is a circuit diagram illustrating the structure of an EOR circuit tree of the encoding circuit.

FIG. 7 is a block diagram illustrating the encoding circuit, and FIG. 8 is a circuit diagram illustrating the structure of an EOR circuit tree of the encoding circuit. The encoding circuit is provided inside the processor 11 or outside the processor 11 in the node 1.

As illustrated in FIG. 7, data of 33 bytes is input in an EOR circuit tree 21, and CheckBit of 24 bits is output therefrom. The EOR circuit tree 21 includes EOR circuits 211 connected as illustrated in FIG. 8, and output CheckBit[23] with respect to Data[262] to Data[5]. The EOR circuit tree 21 obtains EOR for every bit of "1" in the generator matrix illustrated in FIGS. 6 and 7.

Data and the CheckBit of an error correction code are stored in the main storage memory 13 (DIMM 130) as illustrated with FIG. 4.

Decoding Circuit

Figure 9:
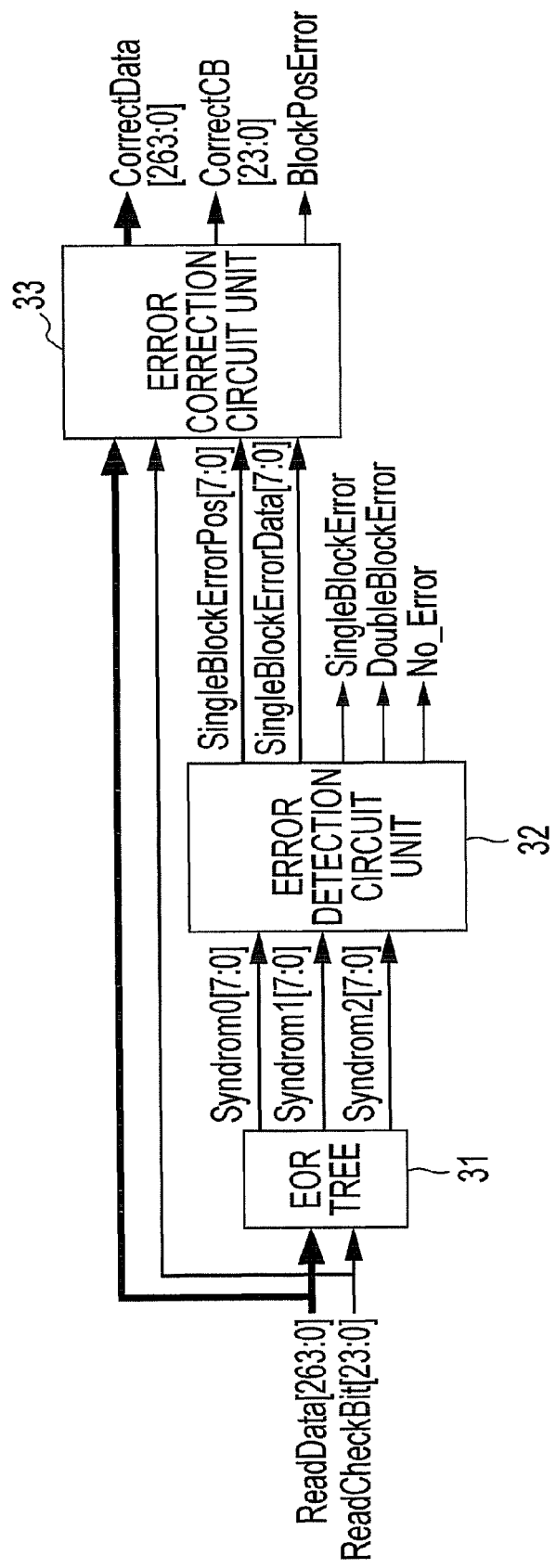
FIG. 9 is a block diagram illustrating a decoding circuit.

FIG. 9 is a block diagram illustrating a decoding circuit. The decoding circuit includes an EOR circuit tree 31, an error detection circuit unit 32, and an error correction circuit unit 33 which are connected as illustrated in FIG. 9. The decoding circuit is provided inside the processor 11 or outside the processor 11 in the node 1.

The EOR circuit tree 31 has the same structure as the EOR tree 21 illustrated in FIG. 8, so that the diagram and description are omitted. The EOR circuit tree 31 generates syndrome0[7:0], syndrome1[7:0], syndrome2[7:0] described below based on the encoded data ReadData[263:0] and check bit ReadCheckBit[23:0].

In the embodiment, three types of syndromes of 8 bits are generated for $S_8EC-D_8ED$. Formally, this is practically the same as to generate a syndrome of 24 bits. However, for the sake of simple description of the error detection and correction processing, the syndromes are expressed by $S_0, S_1, S_2$. Assuming that the code read from the main storage memory 13 (DIMM 130) is expressed by a polynomial representation Y(x) of 36 bytes for both of the data and check bit, the syndromes $S_0, S_1, S_2$ are expressed by an abstract expression of the syndrome generator matrix of $S_n=Y(\alpha^n)$ (n=0, 1, 2). That is, Y(x) is a polynomial representation of the code which is a target for which an error is detected (that is, error detection target). Herein, the read data string D' is expressed by D'=d'$_{263}$, ..., d'$_0$, c'$_{23}$, ... c'$_0$. Since there is a possibility that data is broken or an error is mixed during stored in the DIMM 130, when a sign of "'" is attached to the data after read to distinguish with the data before storage, the read code is expressed by the following polynomial representation Y (x).

$$Y(x) = \sum_{i=0}^{32}\left(\sum_{j=0}^{7}d'_{(8i+j)}\alpha^j\right)x^{i+2} + \sum_{i=0}^{2}\left(\sum_{j=0}^{7}c'_{(8i+j)}\alpha^j\right)x^i \quad \text{Equation 4}$$

Herein, similarly to the case when the aforementioned generator matrix is made, the syndromes $S_0$, $S_1$, $S_2$ is also expressed by linear combination in which only one is 1 in a bit string formed by read data and check bit. Also in this case, similarly to the case of encoding, the generator matrix for obtaining the syndromes $S_0$, $S_1$, $S_2$ is obtained by lowering the order by using $\alpha^8=\alpha^4+\alpha^3+\alpha^2+1$. Although check bit is involved, the method for obtaining the matrix for obtaining the syndromes $S_0$, $S_1$, $S_2$ is similar to the method used when encoding, so that the description will be omitted.

In the following matrix representation, $S_0=\Sigma S0_i\alpha^i$, $S_1=\Sigma S1_i\alpha^i$, $S_2=\Sigma S2_i\alpha^i$, and each $S_0$ $S_1$ $S_2$ is the value 0 or 1.

Figure 10:
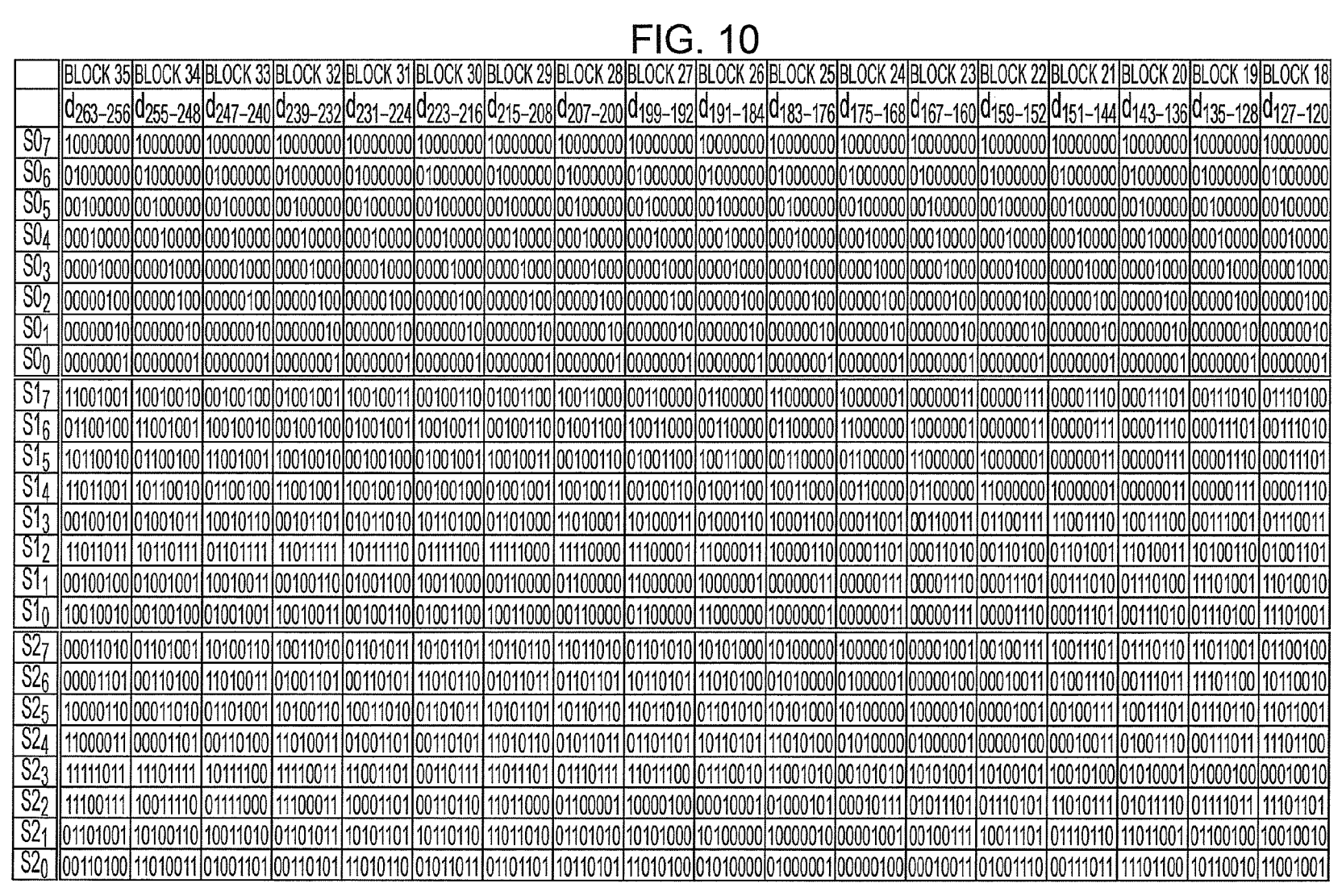
Figure 11:
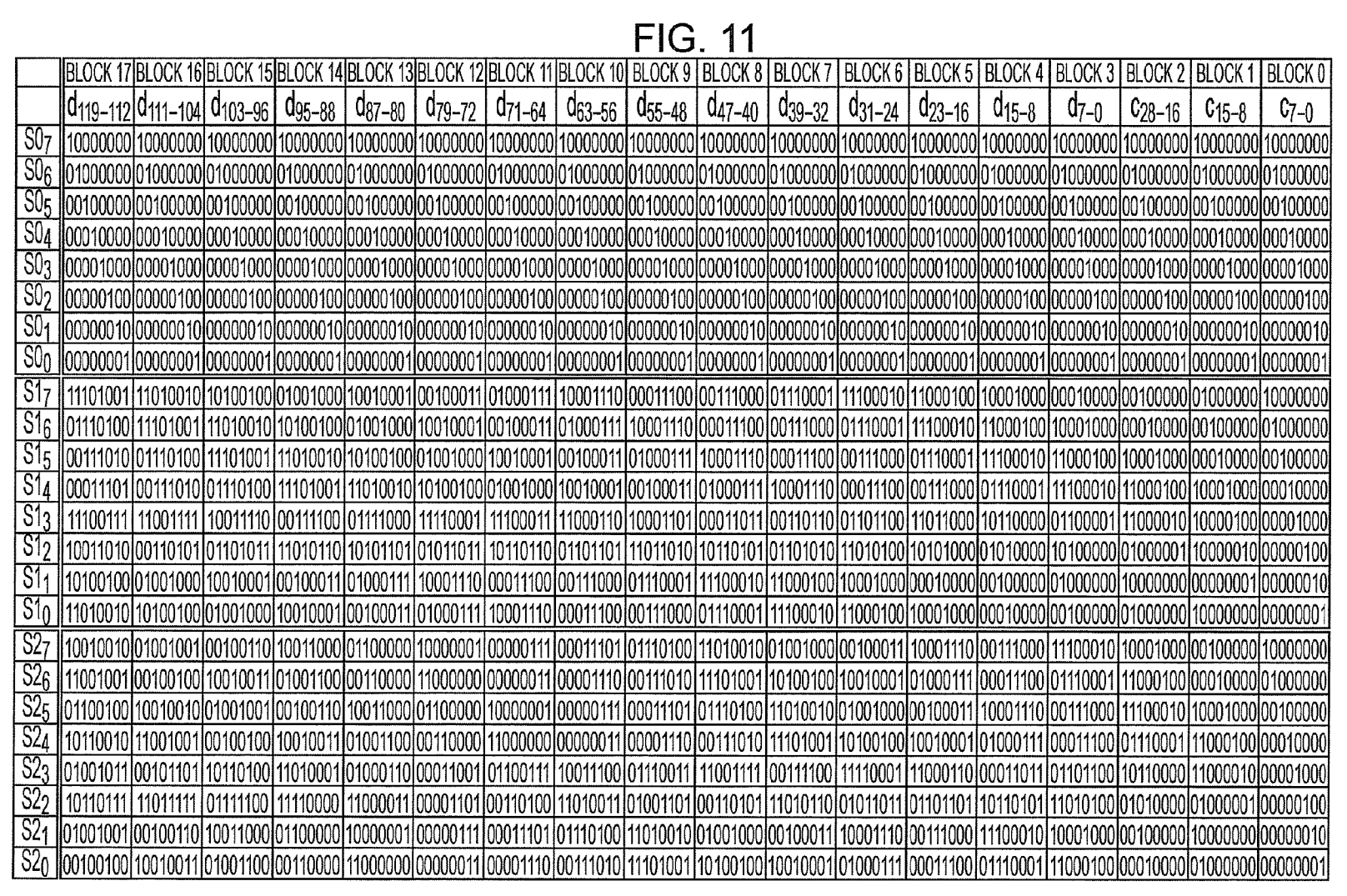

FIG. 10 and FIG. 11 are diagrams illustrating an example of a matrix for obtaining the syndromes. FIG. 10 and FIG. 11 illustrate generator matrix elements $S0_7$ to $S0_0$ of the syndrome $S_0$, generator matrix elements $S1_7$ to $S1_0$ of the syndrome $S_1$, generator matrix elements $S2_7$ to $S2_0$ of the syndrome $S_2$ for the block number Block35 to Block0.

Figure 12:
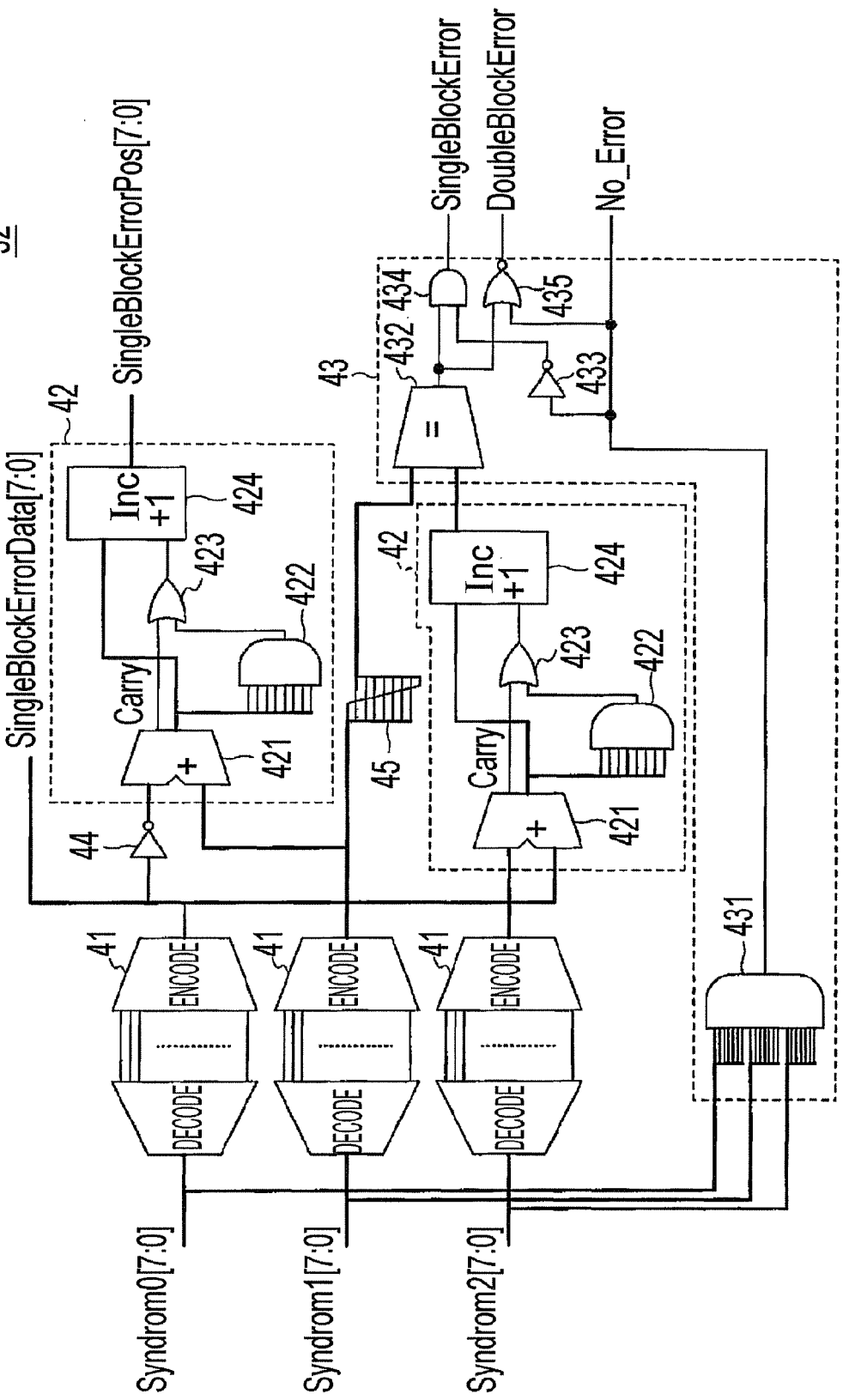
FIG. 12 is a circuit diagram illustrating an error detection circuit unit.

FIG. 12 is a circuit diagram illustrating the error detection circuit unit 32. The error detection circuit unit 32 includes a decode/encode circuit 41, an adder circuit 42 with an index number part mod 255, an error judging circuit 43, an inverter circuit 44, and a rearrangement circuit 45.

When all of the values of the three syndromes $S_0$, $S_1$, $S_2$ obtained as described above are not zero, there is no error. When at least one of the syndromes is not zero, there is some sort of error. When at least one syndrome is not zero, if the equation $S_1^2=S_0S_2$ is satisfied in the Galois extension field ($2^8$), there is one block error that can be restored. As a Reed-Solomon code, when equality of the equation is not satisfied, there is a two block error. However, it will never happen that equality of the equation is satisfied and $S_0=0$, that is, that there is not less than three block error. When equality of the equation is not satisfied, there is not less than two block error, and since this exceeds performance of $S_8ED$, it is impossible to correct (restore) the data. However, it is possible to detect the data by the performance of $D_8ED$. In this manner, when correction of data is impossible, it is important to notify the error by a system, or to execute an appropriate processing such as an error mark processing. Further, it is also important to consider that $\alpha^{255}=1$ herein.

As described above, since the syndromes $S_0$, $S_1$, $S_2$ are expressed by the sum of the term of α of not less than 7-th degree of $S_0=\Sigma S0_i\alpha^i$, $S_1=\Sigma S1_i\alpha^i$, $S_2=\Sigma S2_i\alpha^i$, it is not easy to evaluate the equation $S_1^2=S_0S_2$ in the condition. Consequently, the logarithmic conversion illustrated in FIG. 13 is executed by the decode/encode circuit 41 with respect to the both of the evaluation and an error correction processing described below. FIG. 13 is a diagram illustrating an example of the logarithmic conversion, and illustrates a content of a logarithmic conversion chart. When following the logarithmic conversion chart while regarding $Sn_7$, $Sn_6$, $Sn_5$, $Sn_4$, $Sn_3$, $Sn_2$, $Sn_1$, $Sn_0$, (n=0, 1, 2) as numerical values of one hexadecimal number two digit (binary number eight digit), the intersection indicates the power index k of $\alpha^k$. The logarithmic conversion chart is used when there is a bit error, so that neither the syndrome $S_0$ nor the syndrome syndromes $S_1$ is not zero. Accordingly, the domain of the logarithmic conversion chart is not less than 1. Note that the content of the logarithmic conversion chart is illustrated by hexadecimal number. The logarithmic conversion chart is obtained by lowering the order by $\alpha^8=\alpha^4+\alpha^3+\alpha^2+1$ with respect to each of $\alpha^n$ (n=0, ..., 254).

In this manner, based on the syndrome0[7:0], syndrome1[7:0], Syndrome2[7:0] output from the EOR circuit tree 31, three decode/encode circuits 41 outputs syndrome Alog_Syndrome0[7:0], Alog_Syndrome1[7:0], Alog_Syndrome2[7:0] after logarithmic conversion, and outputs SingleBlockErrorData[7:0] indicating one block error.

The adder circuit 42 includes an accumulator 421, an AND circuit 422, an OR circuit 423, and an increment circuit 424. A carry bit of the accumulator 421 is input in the OR circuit 423. The carry bit of the increment circuit 424 is ignored. The adder circuit 42 executes remainder calculation including mod 255 operation in order to calculate judgment of a block error and the position of the block error.

In FIG. 12, the syndrome Alog_Syndrome0[7:0] output from the decode/encode circuit 41 at the most upper side is input in the adder circuit 42 at the upper side via the inverter circuit 44, and the syndrome Alog_Syndrome1[7:0] output from the second decode/encode circuit 41 from the top is input in the adder circuit 42 at the upper side. The adder circuit 42 at the upper side outputs SingleBlockErrorPos[7:0] indicating the position (that is, the position of the byte which is to be corrected) p of one block error.

Further, in FIG. 12, the syndrome Alog_Syndrome0[7:0] output from the decode/encode circuit 41 at the most upper side is input in the adder circuit 42 at the lower side, and the syndrome Alog_Syndrome2[7:0] output from the decode/encode circuit 41 at the most lower side is input in the adder circuit 42 at the lower side. The product of the syndrome $S_0$ and the syndrome $S_2$ after logarithmic conversion is provided by addition of the power index part, so that the adder circuit 42 at the lower side outputs Alog_Syn2_PL_Syn0_mod [7:0] witch is the addition result of the power index part. In this manner, addition of the power index part considering $\alpha^{255}=1$ ($=\alpha^0$) is provided.

The error judging circuit 43 includes an accumulator 431, a matching detection circuit 432, an inverter circuit 433, an AND circuit 434, and a NOR circuit 435. Syndrome0[7:0], Syndrome1[7:0], Syndrome2[7:0] output from the EOR tree 31 are input in the accumulator 431. Bit No_Error indicating that there is no error is output from the accumulator 431. Alog_Syndrome1[6:7,0] output from a rearrangement circuit 45 that executes rearrangement of bit of the syndrome Alog_Syndrome1[7:0] output from the second decode/encode circuit 41 from the top, and Alog_Syn2_PL_Syn0_mod [7:0] of the adder circuit 42 at the lower side are input in the matching detection circuit 432 as illustrated in FIG. 12. Bit SingleBlockError indicating one block error is output from the AND circuit 434. Bit DoubleBlockError indicating two block error is output from the NOR circuit 435. In this manner, $S_1^2$ is realized by the rearrangement of the bit of the index number part if considering $\alpha^{255}=1$)($=\alpha^0$), and the classification is attained by executing the matching detection of the syndromes $S_0$, $S_2$.

Figure 14:
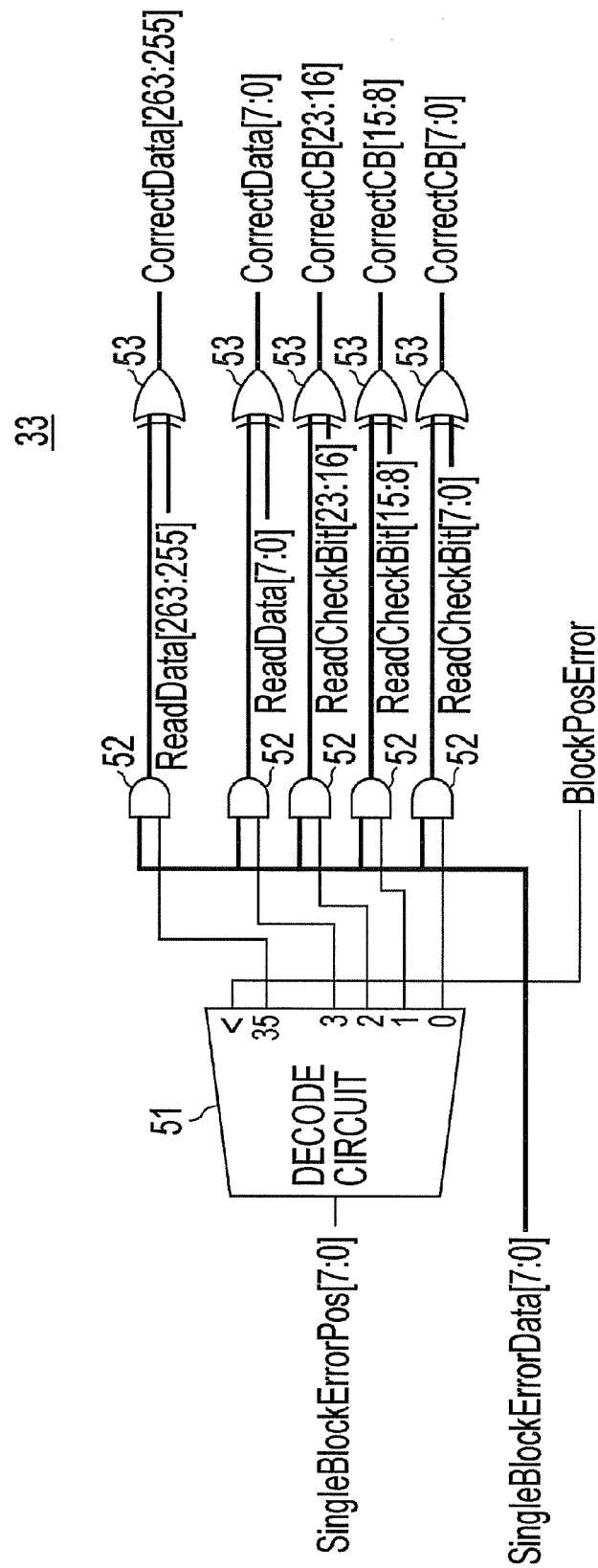
FIG. 14 is a circuit diagram illustrating an error correction circuit unit.

FIG. 14 is a circuit diagram illustrating the error correction circuit unit 33. The error correction circuit unit 33 includes a decode circuit 51, 36 AND circuits 52, and 36 EOR circuits 53 that are connected as illustrated in FIG. 14. SingleBlockErrorPos[7:0] indicating the position p of one block error output from the adder circuit 42 at the upper side in FIG. 12 is input in the decode circuit 51. The output of 36 bits of the decode circuit 51 is input in the corresponding AND circuits 52. Further, the decode circuit 51 outputs value BlockPosError indicating the position of not less than one block error. SingleBlockErrorData[7:0] indicating one block error output from the decode/encode circuit 41 is also input in each AND circuit 52. Output of the corresponding AND circuit 52 and data ReadData[253:255] to ReadData[7:0] are input in the 33 EOR circuits 53 at the upper side, and the 33 EOR circuits 53 at the upper side outputs correction data CorrectData[263: 255] to CorrectData[7:0]. Further, output of the corresponding AND circuit 52 and check bit ReadCheckBit[23:16], ReadCheckBit[15:8], ReadCheckBit[7:0] are input in the three EOR circuits 53 at the lower side, and the three EOR circuits 53 at the lower side output correction check bit CorrectCB[23:16], CorrectCB[15:8], CorrectCB[7:0]. That is, correction data CorrectData[263:0], correction check bit CorrectCB[23:0], and value BlockPosError indicating the position not less than one block error are output from the error correction circuit unit 33.

Since the correction data CorrectData[263:0] output from the error correction circuit unit 33 becomes correct data to which an error correction processing is subjected (that is, after correction), the correction data may be used in the case of not a two block error. Further, when the correction check bit CorrectCB[23:0] output from the error correction circuit unit 33 is not used after the processing, a circuit portion generating the correction check bit CorrectCB[23:0] among the error correction circuit unit 33 may be omitted. Further, when the value of SignalBlockErrorData[7:0] indicating the position p of one block error is not within the range of 0 to 35, that is, not less than 36, it is judged to be much block error, and is dealt similar to tow block error.

If the equation $S_1^2 = S_0 S_2$ is satisfied, the syndrome $S_0$ indicates correction data, and the byte position p which is to be corrected is obtained by $S_0 \alpha^p = S_1$ in Galois extension field GF ($2^8$). Accordingly, an error is corrected by operating EOR with the syndrome $S_0$ with respect to 8 bit data that exists at the block position p of the read data, and the performance of $S_8EC$ may be assured.

Note that since $\alpha^{255} = 1 (= \alpha^0)$ is satisfied, when constituting a circuit for equal sign formation detection or error position detection of the equation $S_1^2 = S_0 S_2$ in the Galois extension field GF ($2^8$) when adding power index, it goes without saying that it is important to consider that there is a case that the addition result of power index may be not only 0, but also 255.

Next, the circuit scale and latency of the encoding circuit and the decoding circuit of the aforementioned embodiment will be described.

As is understood from the size of the generator matrix, the circuit scale of the encoding circuit is 24 EOR circuits of about 140 bits. The latency of the encoding circuit is about 9 steps of EOR circuits of 2 bits since an EOR circuit tree is used.

In the decoding circuit, the scale of the circuit for generating syndromes (syndrome $S_0$ is slightly smaller than other syndromes due to sparse matrix) is 24 EOR circuits of about 140 bits. The latency of the circuit for generating syndromes is about 9 steps of EOR circuits of 2 bits since an EOR circuit tree is used similarly to the encoding circuit. The error detection circuit unit and the error correction circuit unit require at leas three circuits for logarithmic conversion from 8 bits to 8 bits in order to execute an error correction processing from a generated syndrome, one 8 bit accumulator and matching detection circuit for error judgment, and one circuit for correcting a single block (AND-EOR circuit corresponding to 264 bits). The 8 bit decode/encode circuit that functions as a logarithmic conversion circuit is constituted by an AND-OR circuit. Accordingly, it is important that the latency of the error detection circuit unit and error correction circuit unit is slightly longer than that of the circuit that generates a syndrome.

The check bit of ECC that is simplified as in the aforementioned embodiment makes it possible to correct data even when one chip among the DIMM 130 is broken down. In the case of aforementioned example, 33 bytes among 36 bytes becomes a data area (32 bytes is original data, one byte is a space area that is newly ensured for extra data) as illustrated in FIG. 4. Conventionally, in the aforementioned case, as illustrated in FIG. 3, the main storage memory 13 stores check bit at, for example, the portion of 1 (2 bytes) of the ratio of 8:1. However, in the embodiment, the same reliability of data as in the past is assured even when check bit is stored in the portion of 1 (3 bytes) of the ratio of 11:1 as illustrated in FIG. 4.

In this manner, in the case of the aforementioned embodiment, a space area capable of storing extra data (or information) of one byte may be ensured in the main storage memory 13 by reducing the number of check bit to be required while maintaining the same error correction and detection performance as in the past with respect to 32 byte data. By using the space area of one byte, directory information of ccNUMA, key information of the main frame, and the like may be stored. That is, a part of the area of the main storage memory 13 may be used for string information for keeping cache coherency, information for assuring data, information for protecting a memory, and the like while keeping the same error correction and detection performance as in the past. Accordingly, it becomes possible to improve utilization efficiency of the area of the main storage memory 13 to assure data without increasing the coast of the system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An error judging circuit comprising:
   a first EOR circuit tree that generates a check bit of an error correction code by polynomial remainder calculation of $C(x) = x^2 I(x) \bmod P(x)$ with respect to a polynomial expression $I(x)$ of an original code which is protected from an error with respect to data of m bit block unit by addition in a Galois extension field GF ($2^m$) (m is a natural number not less than 8) in $S_m EC$-$D_m ED$ using (k, k−3) Reed-Solomon code (k is a natural number not more than $2^m$) when $P(x)$ is a primitive polynomial of m-order in a Galois field GF(2), a primitive element in the Galois extension field GF ($2^m$) is $\alpha$, and a root of $P(x) = 0$ is $\alpha^i$ (i=0, . . . , m−1);
   a second EOR circuit tree that generates syndromes $S_0$, $S_1$, $S_2$ from $S_n = Y(\alpha^n)$ (n=0, 1, 2) with respect to code $C(x)$ in which the check bit is added to the original code when a polynomial representation of a code which is to be detected an error and has a possibility that an error is mixed is Y(x); and an error detection circuit unit that detects if there is a one block error, a two block error, or no error based on whether or not an equation of syndromes $S_1^2=S_0S_2$ is satisfied and for detecting a position p of a block error from an equation of syndromes $S_0\alpha^p=S_1$ in the Galois extension field GF ($2^m$).

2. The error judging circuit according to claim 1, wherein the error detection circuit unit includes a logarithmic conversion circuit that obtains the product of syndromes $S_0S_2$ by addition of an index number part.

3. The error judging circuit according to claim 1, further comprising:

an error correction circuit unit that detects positions of not less than one block error based on the position of the two block error and the position of the one block error output from the error detection circuit unit, and for outputs correction data from syndrome $S_0$ When the equation of syndromes $S_1^2=S_0S_2$ is satisfied.

4. The error judging circuit according to claim 2 further comprising:

an error correction circuit unit that detects positions of not less than one block error based on the position of the two block error and the position of the one block error output from the error detection circuit unit, and for outputting correction data from syndrome $S_0$ When an equation of syndromes $S_1^2=S_0S_2$ is satisfied.

5. The error judging circuit according to claim 3, wherein the error correction circuit unit outputs correction data in which an error is corrected for one block error.

6. The error judging circuit according to claim 1, wherein the m equals to 8.

7. The error judging circuit according to claim 6, wherein the data and the check bit input in the second EOR circuit tree is included in data of 32 bytes, check bit of 3 bytes, and extra data of 1 byte obtained by executing two reading by 2 interleave with respect to two 9 byte memory modules as one unit.

8. The error judging circuit according to claim 1, wherein the k equals to 36.

9. A shared memory system in which a plurality of nodes are connected, each node having a processor, a main memory, and a cache memory, wherein each node includes:

a first EOR circuit tree that generates a check bit of an error correction code by polynomial remainder calculation of $C(x)=x^2I(x)modP(x)$ with respect to a polynomial expression I(x) of an original code which is protected from an error with respect to data of m bit block unit by addition in a Galois extension field GF ($2^m$) (m is a natural number not less than 8) in $S_m$EC-$D_m$ED using (k, k−3) Reed-Solomon code (k is a natural number not more than $2^m$) when P(x) is a primitive polynomial of m-order in a Galois field GF(2), a primitive element in the Galois extension field GF ($2^m$) is α, and a root of P(x)=0 is $\alpha^i$ (i=0, . . . , m−1);

a second EOR circuit tree that generates syndromes $S_0$, $S_1$, $S_2$ from $S_n=Y(\alpha^n)$ (n=0, 1, 2) with respect to code C(x) in which the check bit is added to the original code when a polynomial representation of a code which is a target to be detected an error and has a possibility that an error is mixed is Y(x); and an error detection circuit unit that detects if there is a one block error, a two block error, or no error based on whether or not an equation of syndromes $S_1^2=S_0S_2$ is satisfied and for detecting a position p of a block error from an equation of syndromes $S_0\alpha^p=S_1$ in the Galois extension field GF ($2^m$).

10. The shared memory system according to claim 9, wherein the error detection circuit unit includes a logarithmic conversion circuit that obtains the product of syndromes $S_0S_2$ by addition of an index number part.

11. The shared memory system according to claim 9 further comprising:

an error correction circuit unit that detects positions of not less than one block error based on the position of the two block error and the position of the one block error output from the error detection circuit unit, and for outputs correction data from syndrome $S_0$ When the equation of syndromes $S_1^2=S_0S_2$ is satisfied.

12. The shared memory system according to claim 10 further comprising:

an error correction circuit unit that detects positions of not less than one block error based on the position of the two block error and the position of the one block error output from the error detection circuit unit, and for outputting correction data from syndrome $S_0$ When an equation of syndromes $S_1^2=S_0S_2$ is satisfied.

13. The shared memory system according to claim 11, wherein the error correction circuit unit outputs correction data in which an error is corrected for one block error.

14. The shared memory system according to claim 9, wherein the m equals to 8.

15. The shared memory system according to claim 14, wherein the data and the check bit input in the second EOR circuit tree is included in data of 32 bytes, check bit of 3 bytes, and extra data of 1 byte obtained by executing two reading by 2 interleave with respect to two memory modules among plurality of 9 byte memory modules in the main memory as one unit.

16. The shared memory system according to claim 15, wherein the extra data of 1 byte is any of information for keeping cache coherency of data stored in the cache memory of each node, information for data assurance, information for protecting the memory.

17. The shared memory system according to claim 15, wherein the extra data of 1 byte is directory information used in a ccNUMA system.

18. The shared memory system according to claim 9, wherein the k equals to 36.

* * * * *